United States Patent [19]

Sinclair

[11] Patent Number: 4,996,489
[45] Date of Patent: Feb. 26, 1991

[54] LABORATORY TECHNIQUE FOR MEASURING COMPLEX DIELECTRIC CONSTANT OF ROCK CORE SAMPLES

[75] Inventor: Paul L. Sinclair, Clear Lake Shores, Tex.

[73] Assignee: Halliburton Logging Services, Inc., Houston, Tex.

[21] Appl. No.: 331,332

[22] Filed: Mar. 31, 1989

[51] Int. Cl.$^5$ ............................................. G01R 27/04
[52] U.S. Cl. .................................................. 324/639
[58] Field of Search ................. 324/58 R, 58 A, 58 C, 324/58.5 A, 58.5 C, 639, 640, 637

[56] References Cited

U.S. PATENT DOCUMENTS 4,626,773 12/1986 Kroeger .............................. 324/663
4,634,963 1/1987 Lunden ........................... 324/58.5 A

OTHER PUBLICATIONS

Gestblom et al., "A Computer Controlled Dielectric Time Domain spectrometer;" J. Phys. E. Sci. Instrum. vol. 13, No. 10 Oct. 1980 pp. 1067-1070.
Jaeger et al., "Microwave Measurements . . .", The Rev. of Sci. Instrum., vol. 41, No. 6, Jun. 1970, pp. 820-823.
Musil, "New Microwave System . . ." Czech. J. Phys. B 25 [1975], pp. 916-926.
Kilp, "Precise Measurement of the Complex Permittivity . . ." J. Phys. E (GB) Sci. Instrum., vol. 10, No. 10, (Oct. 1977), pp. 985-989.
Szwarnowski et al., "Precision Waveguide . . . ," J. Phys. E. (GB) Sci. Instrum., vol. 10, No. 11 (Nov. 1977), pp. 1163-1167.
Weir, "Automatic Measurement of Complex . . . ," Proc. IEEE., vol. 62, No. 1, (Jan. 1974) pp. 33-36.

Primary Examiner—Gerard R. Strecker
Assistant Examiner—Maura K. Regan
Attorney, Agent, or Firm—William J. Beard

[57] ABSTRACT

A system for measuring the complex dielectric constant of a core sample is set forth. It incorporates a circular wave guide having a central axial transmitter coil. Equally spaced axial receiver coils are placed on both sides of the transmitter coil. The opposite polarity receiver signals are connected to an adder circuit to provide an output signal representing only the difference in the two received signals. By placing a standard such as air between the transmitter coil and one receiver coil, or core sample positioned between the transmitter coil and the other receiver coil provides a system for obtaining an output indicative of complex dielectric constant. Optionally, the system is operated in an oven to provide an elevated temperature, and can also be pressurized with a compressed fluid.

14 Claims, 2 Drawing Sheets

LABORATORY TECHNIQUE FOR MEASURING COMPLEX DIELECTRIC CONSTANT OF ROCK CORE SAMPLES

BACKGROUND OF THE DISCLOSURE

The present disclosure is directed to an apparatus and a method for measuring the complex dielectric constant of a core sample When drilling a well, a core sample is periodically taken, and especially is obtained during drilling at or near formations of interest. The core sample is retrieved to the surface and various tests are made on the sample. The test results suggest certain drilling procedures including whether or not further drilling should be conducted, and also suggest implementation of various and sundry completion techniques. Since such data is useful, measuring various parameters of the core sample becomes quite important in the drilling procedure.

One of the important procedures which is typically carried out with geological formations is to measure the dielectric properties of the formation. Also, this is done with core samples. The dielectric constant however is not a simple variable; rather, it is a complex variable having resistive and reactive components. The typical form of the dielectric constant is $A+jB$ where A and B are vector components at a 90° angle, and further where B is the reactive component which is also typically related to bulk resistivity. In many instances, a well, partially or wholly drilled, yields one or more core samples which have to be tested in a laboratory facility, and the present procedure sets forth a method and apparatus for testing core samples and, particularly, cylindrical core samples. Both A and B are typically variable with frequency.

The core sample testing procedure begins in the field where a cylindrical core sample is first obtained. It is delivered to the laboratory or even to a field location where the present apparatus is located. The equipment utilizes a cylindrical wave guide which has three coupled but separated coils therein. The first or center coil serves as the transmitter coil. It includes one or more turns which are connected and deployed for propagation of a signal in both directions along the wave guide. First and second duplicate receiving coils are arranged parallel to the transmitting coil and are spaced from the transmitting coil by equal distances. Indeed, these distances are preferably held quite close so that the two receiving coils receive the signal propagated from the transmitting coil over equal distances. The received signals are picked up at the two receiving coils. They form output signals. The two output signals are delivered to an adder circuit. The receiving coils and the adder circuit are arranged so that two received signals substantially cancel, and the difference signal is then output from the adder to a network analyzer or a vector voltmeter. This measures the complex impedance and enables representation of the sample load in the form of $A+jB$. A signal generator connected with an amplifier is incorporated in the network analyzer to control timing so that the system operates in a synchronized fashion. Output signals are provided to the network analyzer from the transmitter coil and the adder. By proper calibration, the displayed signals at the analyzer can be evaluated and the $A+jB$ complex dielectric constant can then be determined. This constant is in part dependent on frequency, and accordingly, the signal generator can be adjusted in frequency so that a selected frequency band can be tested. When this is done, different values are obtained to the extent the sample is frequency sensitive.

One of the significant advantages of the present system is the incorporation of the sample in a "circuit" without electrode contact. This is, the sample is placed in a circuit but this is accomplished without attempting electrode connection. Electrode contacts are difficult to connect to core samples.

Representative contact procedures are set out in U.S. Pat. Nos. 3,774,237 and also 3,895,289. Such core sample shaping and contact attachment are inconsistent and require much more handling.

Somewhat different approaches are also described at the article by Fuller & Ward reported at *IEEE Transactions on Geoscience Electronics*, Vol. GE 8, No. 1, January 1970 or the 1953 Geophysics article of Ward. A more recent approach is found in the Rau & Wharton article reported at *Journal of Petroleum Technology*, November 1982, pages 2689-2700. These however do not involve the disclosed process of placing the core sample in a guide and comparing the sample signal with a signal from a reference, and outputting a value of $A+jB$ form.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
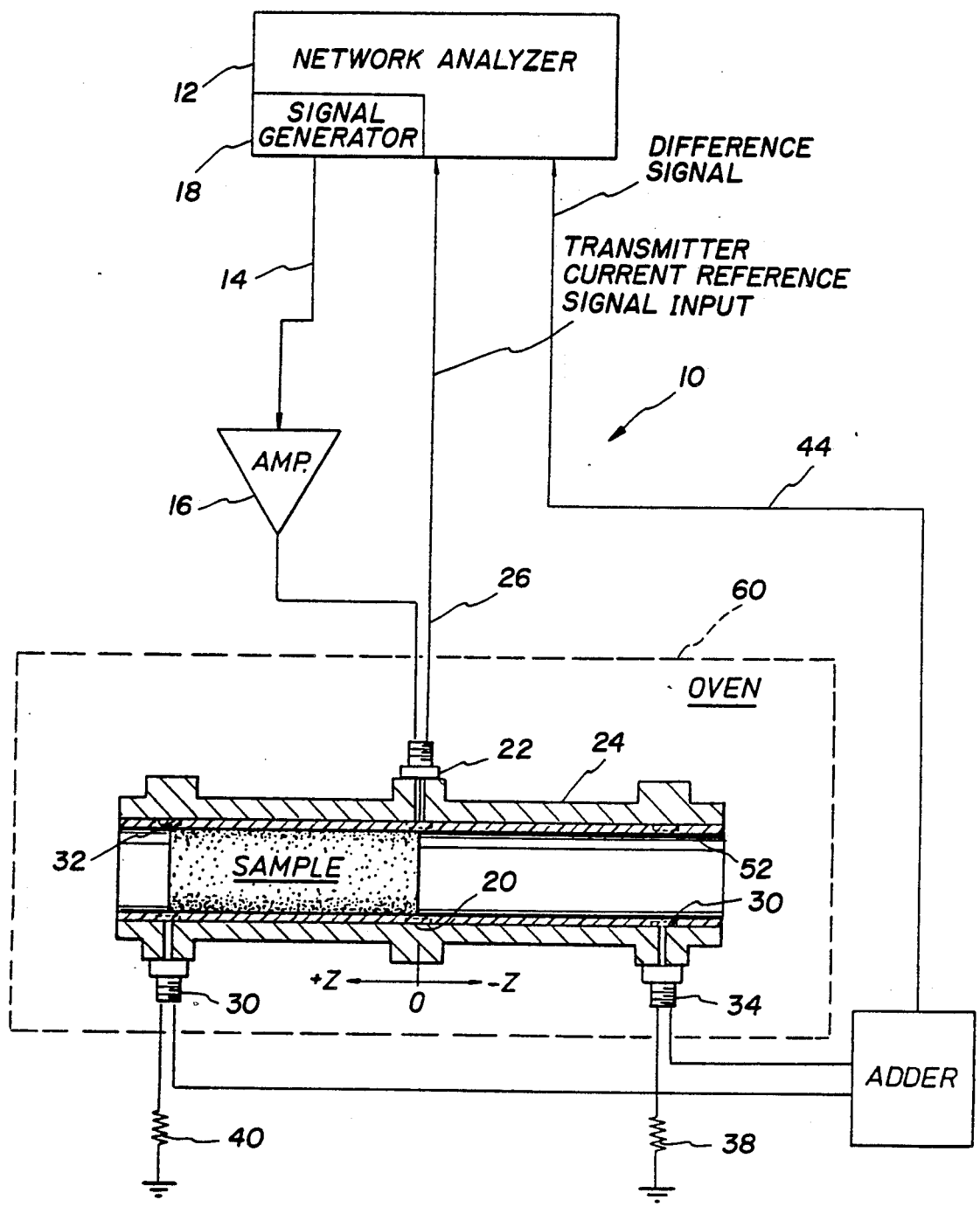
FIG. 1 is a schematic showing a cylindrical wave guide supporting a central transmitter coil equally spaced left and right receiver coils, and thereby defining a sample receiving area on one side of the transmitter coil and further includes a signal generator in a network analyzer and a circuit adder for the two receiver coils for presenting the output signal to a user.

The present disclosure is directed to an apparatus which will be described first and its operation will be given thereafter. Selected equations will be provided setting forth a voltage measurement along with a description of the apparatus and how the complex dielectric constant is obtained from the measuring system shown in FIG. 1. The numeral 10 identifies the dielectric testing system of the present disclosure. It incorporates a network analyze 12 which includes a signal generator 18 forming a signal which is either pulsed or CW. One suitable network analyzer is the HP model 3577A. Thus, FIG. 1 shows the signal generator which is actually part of the analyzer to place attention on the transmitted signal. The amplifier 16 is normally inserted as a separate device to boost the power. The amplifier 16 is enabled and thereby forms a fixed amplitude output at an adjustable frequency and which signal has a particular duration or is continuous, and is at a specified power level. The signal is delivered to a transmitter coil 20 which is arranged as a circle in a circular wave guide to be described. The coil 20 thus has one or more turns and forms an electromagnetic field directed along the wave guide.

The coil 20 is a microstripline having a characteristic impedance of 50 ohms. It is wound in a single turn circle encompassing 360° less the spacing of the two adjacent coaxial connectors at 22, one serving as the CW or pulse input and the other connecting via the line 26 to the analyzer 12. The input signal from the generator 18 (after amplification) is supplied through the coaxial terminal 22 and then forms a field (described below) in the wave guide 24.

The wave guide 24 supports two receiver coils. One is identified at 30 and the other is located at 32. The two coils are receiver coils spaced at equal distances from the transmitter coil 20. Again, they are provided with coaxial connectors at 34 and 36. They are preferably duplicate coils formed of microstripline and have a resistor connected to ground for each, namely, the resistors at 38 and 40. The resistors match the characteristic impedance, normally 50 ohms. This termination avoids reflection. The duplicate coils provide output signals to an adder 42 to be described. The adder may be a 180° hybrid coupler or a binary power divider such as ANZAC model H-1-4. The two signals are added which takes into account a polarity reversal of one relative to the other so that the differences between the two signals are output on the conductor 44. That is input to the analyzer for measurement of the quadrature components. Conductors 14, 26, and 44 are typically coaxial transmission lines of 50 ohms characteristic impedance.

A core sample 50 is placed in the wave guide 24. The core sample is located in accordance with a coordinate system origin defined at the transmitter coil 20. The coordinate system has an origin marked in FIG. 1 and positive and negative measurements are indicated along the axis of the wave guide 24. The core sample has a length L which is equal to the spacing of the coils 20 and 32; that is, L is length along the +Z axis. The core 50 fits snugly within the wave guide and its liner 52. The wave guide is constructed as a metal wave guide body on the exterior and a thin insulating lining 52 is on the interior. It is however sufficiently thick to embed the coils 20, 30 and 32 which are placed in it.

The preferred liner 52 is a dimensionally stable ceramic or quartz sleeve which accurately (without change) fixes the spacing between the three coils 20, 30 and 32. The liner 52 is also accurately sized in diameter to control the diameter of the coils. This positions the coils to form the field as discussed below.

OPERATION OF THE PRESENT APPARATUS

Ideally, a core sample should suffer the absolute minimum in disturbance from its natural condition prior to making measurements in the laboratory. The present procedure provides a complex dielectric constant measuring system so that electrode contact impedance is avoided by the implementation of this procedure. That is one of the serious drawbacks of previously used systems. One previous approach requires drilling holes in the core sample while another process requires machining; in both cases, fluid remaining in the core is likely lost while the structure is physically altered. By this method, the core sample is cut from the formation and retrieved without alteration. This absence of subsequent cutting protects the connate fluids. The dielectric properties of the core sample 50 may vary as a function of frequency. The signal generator 18 is swept over a wide range of frequencies and the core sample 50 can thus be tested for many frequencies say, 10 to 1,000 megahertz or greater. An important factor in this apparatus is the use of a bridge circuit so that the sample 50 is compared with an equal size sample which is air in the preferred instance. The sample size (derived from coil spacing) is equal along the measured Z-axis (see FIG. 1) as indicated in the drawings from origin at the transmitter coil 20 to the two receiver coils. With exercise of reasonable care, these two distances L are made equal. The distances are thus controlled to within just a few parts per million by embedding the coils as microstriplines in a ceramic or quartz body. The use of equally spaced receiver coils is important to assure balancing of the two output signals so that nearly total cancellation is obtained. Air is the preferred standard on the right side of the system, that is, between the coil 20 and the receiver coil 30. Alternative materials can be used, provided they are cut into cylinders of specified size, preferably precisely equal to the size of the sample 50 and preferably positioned so that they align with the zero or reference mark on the wave guide 24. Sample diameter should be uniform because the signal varies as a fourth power of diameter. This is more significant than sample length. Examples of alternate materials are fused silica, alumina, Teflon (a registered trademark of the DuPont Company), carbon particles in epoxy resin, and the like. Known sample can be used to calibrate to precise dielectric values. A Teflon sample will provide a precise lossless, nondispersive dielectric. A carbon filled resin sample will provide a frequency independent measure of conductivity. Indeed, it is possible to use other rock samples which have known dielectric measures if desired.

Figure 2:
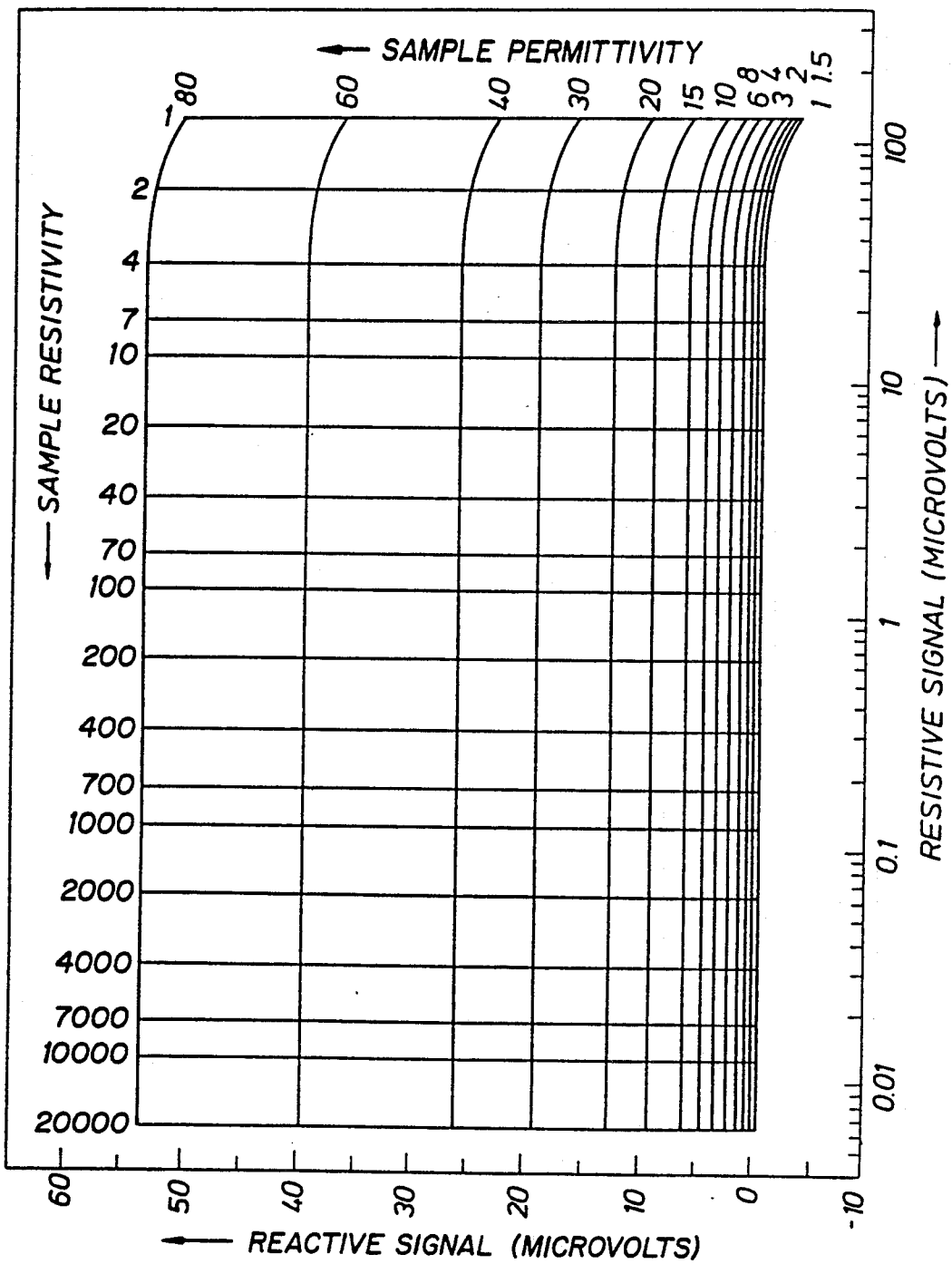
FIG. 2 is a chart of data for interpreting a complex dielectric property measurement.

There is mutual coupling between the coil 20 and each of the two receiver coils. With no core in either side, the system is zeroes initially by adding of the two receiver output signals at the adder 42. Thus, the summed output signal from the adder 42 represents the disturbance in the mutual coupling which arises from the differences between the sample 50 and the reference core (air or the reference sample) on the other side of the system. For a given frequency, measurements are made of the adder output voltage, therebeing two measurements, one of the inphase voltage and the other measuring the quadrature voltage. If desired, a chart can be compiled for a multitude of frequencies to provide a direct reading of the complex dielectric constant. FIG. 2 is a chart of data collected at a fixed frequency (40 megahertz) showing the reactive and resistive signals in microvolts. The chart shows measured signal conversion into the A +jB form to provide both components. The complex voltages at the two receiver locations are given by the two equations below. The equations are developed on the premise that a uniform (or single) reference such as air is located between the coils 30 and 50. Accordingly, the coil 30 is at the distance of L in the $-Z$ direction. The coil 32 is located at the opposite maximum distance which is L in the Z direction. The core sample has been shown in the drawings to have a length L which spans the distance L from $Z_0$. The test analysis is based on the assumption that the coils are pure magnetic dipoles. Suitable electric shields at one or more of the electric coils may be necessary.

The core sample may be longer than L without materially impacting the results, establishing that the length is not a critical dimension. The voltages induced in the two receiver coils may be computed from the following expressions. On review of the equations given below, it will be seen intuitively how use of a full length sample between the two coils 32 and 50 simplifies the measurements of lengths of the sample.

$$V_{30} = -2\pi IN^2 \left(\frac{a}{b}\right)^2 \Sigma_n Z_n \left[\frac{J_1(pa)}{J_0(pb)}\right]^2 \frac{\tau_{01}(e^{jKL} + \gamma_{01}e^{3jKL})}{1 - \gamma_{01}^2 e^{2jKL}}$$

$$V_{32} = -2\pi IN^2 \left(\frac{a}{b}\right)^2 \Sigma_n Z_n \left[\frac{J_1(pa)}{J_0(pb)}\right]^2 \frac{\tau_{01}\tau_{10}e^{jKL}}{1 - \gamma_{01}^2 e^{2jKL}}$$

where:
$V_{30}$ = voltage in coil 30 with air reference of length L
$V_{32}$ = voltage in coil 32 adjacent to sample of L length
I = current flowing in transmitter coil
N = number of turns on a coil, all coils the same
a = radius of coil, all coils the same
b = radius of inside of metal wave guide
$Z_n$ = wave guide impedance for mode n
$J_i$ = Bessel Function of order i
P = argument normalized to b
$\tau_{01}, \tau_{10}$ = transmission coefficients of core sample at interface to air
$\gamma_{01}$ = reflection coefficient of core sample at interface to air
K = propagation constant for core sample (related to complex dielectric constant)
L = length of core sample and receiver/transmitter coil spacing
$j = (-1)^{\frac{1}{2}}$ A small, constant adjustment is required for all measurements resulting from the face that the core sample is slightly smaller in diameter than the wave guide inside diameter.

In summarizing the present apparatus and method, it should be noted that some occasions will present the need of measuring the complex dielectric constant at an elevated temperature. To this end, an oven 60 is included to raise the temperature of the sample in the wave guide sufficiently to cause duplication of ambient temperatures. The oven 60 therefore provides heating to a level typically up to about 400° F. A closed and sealed oven will provide pressure for the sample for testing at an elevated pressure up to that normally experienced at the formation well depth.

While the foregoing is directed to the preferred embodiment, the scope thereof is determined by the claims which follow.

What is claimed is:

1. A method of measuring the complex dielectric constant of a core sample obtained from a formation of interest comprising the steps of:
   (a) placing a cylindrical core sample from a formation of interest in a first cavity at a specified temperature and pressure;
   (b) positioning along a cylindrical wave guide
      (1) a transmitter coil for forming an electromagnetic wave in the wave guide;
      (2) a first receiver coil spaced along the wave guide from the transmitter coil;
      (3) a second receiver coil spaced along the wave guide from the transmitter coil;
      (4) wherein the first receiver coil and transmitter coil define a first cavity; and
      (5) wherein the second receiver coil is spaced oppositely the first receiver coil and defines a second cavity opposite the first cavity;
   (c) transmitting a signal from the transmitter coil along the wave guide;
   (d) forming first and second received signals at the first and second receiver coils; and
   (e) responding to the first and second received signals to encode a dielectric measurement in the signal as a function of materials in the cavities.

2. The method of claim 1 wherein said received signals are combined by subtracting to form a difference voltage signal, and said difference signal has a resistive component and a reactive component relative to the transmitted signal.

3. The method of claim 2 including the step of determining sample dielectric resistive and reactive components.

4. The method of claim 1 including the step of defining the first cavity at a length of L and cutting the core sample to a length of at least L.

5. The method of claim 4 including the step of forming the second cavity at the length L.

6. The method of claim 1 wherein the wave guide has a diameter of D, and including the additional step of cutting the core sample to a diameter sufficiently close to D to enable the core sample to fit within the wave guide with a clearance sufficiently small to effectively direct the transmitted field into the core sample.

7. The method of claim 1 wherein the core sample loss is measured.

8. The method of claim 1 wherein the core sample is maintained at a temperature approximately equal to the formation temperature.

9. The method of claim 1 wherein the transmitted signal is in the range of about 10 to about 1,000 megahertz.

10. The method of claim 1 including the step of measuring the signal in the form of inphase and quadrature components.

11. Apparatus for measuring the dielectric constant of a core sample, comprising:
   (a) a transmitter antenna directed to irradiate a selected volume including a portion of a wave guide with RF radiation directed through said wave guide;
   (b) said selected volume containing a core sample and a reference dielectric at least partially filling said selected volume;
   (c) means, including at least two spaced receiver antennae, for forming first and second receiver signals resulting from irradiation by said transmitter antenna of the core sample and the reference dielectric in said selected volume;
   (d) means provided with said first and second receiver signals for obtaining an indication of dielectric constant; and
   (e) wherein said transmitter and receiver antennae both comprise continuous microstripline transmission lines concentric in a circular metal wave guide.

12. The apparatus of claim 11 including means for directing a transmitter signal through said transmitter antenna to be received at said receiver antennae, and further including means providing duplicate transmission through the core sample and the reference dielectric.

13. The apparatus of claim 11 including circuit means provided with said first and second receiver signals to obtain a difference signal encoding the dielectric constant.

14. The apparatus of claim 11 wherein said transmission lines are terminated in a characteristic impedance.

* * * * *